US010998871B2

(12) United States Patent
Soga

(10) Patent No.: US 10,998,871 B2
(45) Date of Patent: May 4, 2021

(54) POWER AMPLIFIER CIRCUIT

(71) Applicant: Murata Manufacturing Co., Ltd., Kyoto (JP)

(72) Inventor: Takashi Soga, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/150,607

(22) Filed: Oct. 3, 2018

(65) Prior Publication Data
US 2019/0103847 A1   Apr. 4, 2019

(30) Foreign Application Priority Data

Oct. 4, 2017 (JP) .............. JP2017-194175
Jul. 6, 2018 (JP) .............. JP2018-129136

(51) Int. Cl.
| H03F 1/30 | (2006.01) |
| H03G 3/30 | (2006.01) |
| H03F 3/21 | (2006.01) |
| H03F 3/195 | (2006.01) |
| H03F 3/24 | (2006.01) |
| H03F 1/56 | (2006.01) |
| H04B 1/04 | (2006.01) |
| H03F 1/02 | (2006.01) |

(52) U.S. Cl.
CPC ........ H03G 3/3042 (2013.01); H03F 1/0216 (2013.01); H03F 1/56 (2013.01); H03F 3/195 (2013.01); H03F 3/211 (2013.01); H03F 3/245 (2013.01); H04B 1/04 (2013.01); *H03F 2200/451* (2013.01); *H03F 2200/555* (2013.01); *H04B 2001/0416* (2013.01)

(58) Field of Classification Search
CPC ........................................... H03F 1/30
USPC ........................... 330/310, 296, 285
See application file for complete search history.

(56) References Cited

U.S. PATENT DOCUMENTS

| 5,493,255 A * | 2/1996 | Murtojarvi ............ H03F 1/0261 330/296 |
| 6,236,266 B1 * | 5/2001 | Choumei ................ H03F 1/302 330/133 |
| 7,408,412 B2 * | 8/2008 | Yamamoto .............. H03F 1/302 330/285 |
| 7,579,914 B2 * | 8/2009 | Amano ................... H03F 1/302 330/296 |
| 7,768,345 B2 * | 8/2010 | Aoki ...................... H03F 1/0266 330/133 |

(Continued)

FOREIGN PATENT DOCUMENTS

| JP | 2005-217557 A | 8/2005 |
| JP | 2016-213557 A | 12/2016 |

*Primary Examiner* — Henry Choe
(74) *Attorney, Agent, or Firm* — Pearne & Gordon LLP

(57) ABSTRACT

A power amplifier circuit includes a first transistor that amplifies a first signal and outputs a second signal, a second transistor that amplifies a signal corresponding to the second signal and outputs a third signal, a third transistor that supplies a first bias current or voltage to a base of the first transistor, and a fourth transistor that supplies a second bias current or voltage to a base of the second transistor. A ratio of an emitter area of the third transistor to an emitter area of the first transistor is larger than a ratio of an emitter area of the fourth transistor to an emitter area of the second transistor.

18 Claims, 6 Drawing Sheets

(56) References Cited

U.S. PATENT DOCUMENTS 7,893,769 B2 * 2/2011 Asano .................. H03F 1/0211
                                                      330/285
10,050,647 B2    8/2018 Hase

* cited by examiner

POWER AMPLIFIER CIRCUIT

This application claims priority from Japanese Patent Application No. 2017-194175 filed on Oct. 4, 2017 and Japanese Patent Application No. 2018-129136 filed on Jul. 6, 2018, the contents of both of which are incorporated herein by reference in their entirety.

BACKGROUND OF THE DISCLOSURE

1. Field of the Disclosure

The present disclosure relates to a power amplifier circuit.

2. Description of the Related Art

A mobile communication device such as a cellular phone includes a power amplifier circuit for amplifying the power of a radio-frequency (RF) signal to be transmitted to a base station. The power amplifier circuit includes a bias circuit for supplying a bias current to a power amplification transistor. For example, Japanese Unexamined Patent Application Publication No. 2016-213557 discloses a power amplifier circuit including an emitter-follower bias circuit. In the bias circuit, a bias current is outputted from an emitter of a bias-current supply transistor toward a base of an amplification transistor.

In the emitter-follower bias circuit described above, an RF signal affects the amount of bias current. Specifically, if the level of the RF signal increases, a negative current (a current provided from the base of the amplification transistor toward the emitter of the bias-current supply transistor) is generated in the bias current. At this time, the negative current is cut due to the rectifying characteristics of the P-N junction between the base and the emitter of the bias-current supply transistor. Accordingly, the proportion of the bias current flowing in the positive direction increases, resulting in an increase in average bias current. Thus, the gain of the power amplifier circuit increases, leading to the deterioration in the linearity of the gain of the power amplifier circuit.

To address the issue described above, the configuration disclosed in Japanese Unexamined Patent Application Publication No. 2016-213557 includes a current path between the base and the emitter of the bias-current supply transistor to allow the negative current to pass therethrough so as to prevent the negative part of the bias current from being cut. This prevents an increase in average bias current even if the level of RF signal increases.

In the configuration described above, however, a path that allows the negative current to pass therethrough is implemented by a capacitor, and thus the path has frequency characteristics. Accordingly, for example, as is common in multiband technologies, if an RF signal has a frequency range which covers a wide area, the characteristics may vary according to frequency.

BRIEF SUMMARY OF THE DISCLOSURE

Accordingly, it is an object of the present disclosure to provide a power amplifier circuit in which the deterioration in the linearity of the gain is prevented or reduced over a wide range.

According to preferred embodiments of the present disclosure, a power amplifier circuit includes a first transistor that amplifies a first signal and outputs a second signal, a second transistor that amplifies a signal corresponding to the second signal and outputs a third signal, a third transistor that supplies a first bias current or voltage to a base of the first transistor, and a fourth transistor that supplies a second bias current or voltage to a base of the second transistor. A ratio of an emitter area of the third transistor to an emitter area of the first transistor is larger than a ratio of an emitter area of the fourth transistor to an emitter area of the second transistor.

According to preferred embodiments of the present disclosure, it may be possible to provide a power amplifier circuit in which the deterioration in the linearity of the gain is prevented or reduced over a wide range.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes an embodiment of the present disclosure in detail with reference to the drawings. The same or substantially the same elements are assigned with the same numerals and will not be described repeatedly.

Figure 1:
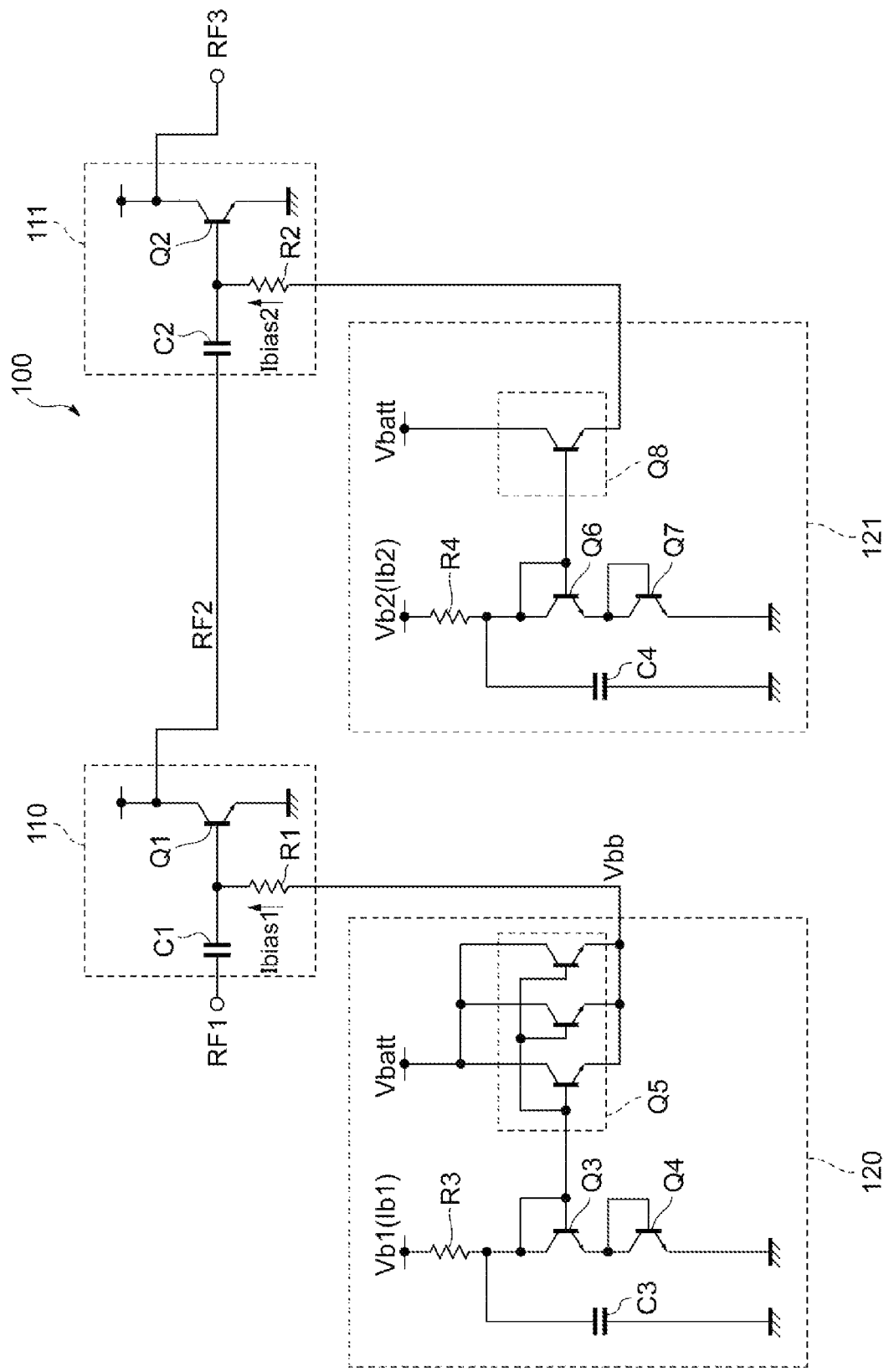
FIG. 1 illustrates an example configuration of a power amplifier circuit according to an embodiment of the present disclosure.

FIG. 1 illustrates an example configuration of a power amplifier circuit according to an embodiment of the present disclosure. A power amplifier circuit 100 illustrated in FIG. 1 is mounted in, for example, a mobile communication device such as a cellular phone and is used to amplify the power of a radio-frequency (RF) signal to be transmitted to a base station. For example, the power amplifier circuit 100 amplifies the power of signals conforming to communication standards such as the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, and LTE-Advanced Pro. Further, for example, the power amplifier circuit 100 amplifies the power of signals of a plurality of different frequency ranges. An RF signal has a frequency of about several hundreds of megahertz (MHz) to several tens of gigahertz (GHz), for example. The communication standards and frequencies of signals to be amplified by the power amplifier circuit 100 are not limited to those described above.

The power amplifier circuit 100 includes, for example, amplifiers 110 and 111 and bias circuits 120 and 121.

The amplifiers 110 and 111 form a two-stage amplifier. The amplifier 110 in the preceding stage (drive stage) amplifies an RF signal RF1 (first signal) and outputs an RF signal RF2 (second signal). The amplifier 111 in the subsequent stage (power stage) further amplifies the RF signal RF2 and outputs an RF signal RF3 (third signal). The number of stages of amplifiers is not limited to two, and three or more stages of amplifiers may be used.

The bias circuits 120 and 121 supply bias currents or voltages to the amplifiers 110 and 111, respectively. Specifically, the bias circuit 120 (first bias circuit) supplies a bias current Ibias1 (first bias current) to the amplifier 110 in the preceding stage. The bias circuit 121 (second bias circuit) supplies a bias current Ibias2 (second bias current) to the amplifier 111 in the subsequent stage. The gains of the amplifiers 110 and 111 are controlled by the amounts of the bias currents Ibias1 and Ibias2, respectively.

Although not illustrated, the power amplifier circuit 100 may include a matching circuit upstream and downstream of each of the amplifiers 110 and 111 to match impedances between the circuits.

Next, a specific example configuration of the amplifiers 110 and 111 and the bias circuits 120 and 121 will be described.

The amplifier 110 in the preceding stage includes, for example, a transistor Q1, a capacitor C1, and a resistance element R1. Likewise, the amplifier 111 in the subsequent stage includes, for example, a transistor Q2, a capacitor C2, and a resistance element R2.

The transistor Q1 (first transistor) and the transistor Q2 (second transistor) are each a bipolar transistor such as a heterojunction bipolar transistor (HBT). The transistor Q1 has a base supplied with the RF signal RF1 and the bias current Ibias1, a collector supplied with a power supply voltage, and an emitter grounded. Accordingly, the transistor Q1 amplifies the RF signal RF1 and outputs the RF signal RF2 from the collector thereof. The transistor Q2 has a base supplied with the RF signal RF2 and the bias current Ibias2, a collector supplied with the power supply voltage, and an emitter grounded. Accordingly, the transistor Q2 further amplifies the RF signal RF2 and outputs the RF signal RF3 from the collector thereof.

The collectors of the transistors Q1 and Q2 may be supplied with the power supply voltage via choke inductors although not illustrated in FIG. 1.

The capacitors C1 and C2 are each a coupling capacitor that blocks the direct-current (DC) component included in an input RF signal and that allows the alternating-current (AC) component in the input RF signal to pass therethrough.

The resistance elements R1 and R2 are respectively connected between the bias circuits 120 and 121 and the bases of the transistors Q1 and Q2. The bias currents Ibias1 and Ibias2 are respectively supplied via the resistance elements R1 and R2, which prevents an increase in the bias currents Ibias1 and Ibias2 caused by an increase in the temperature of the transistors Q1 and Q2.

Figure 2:
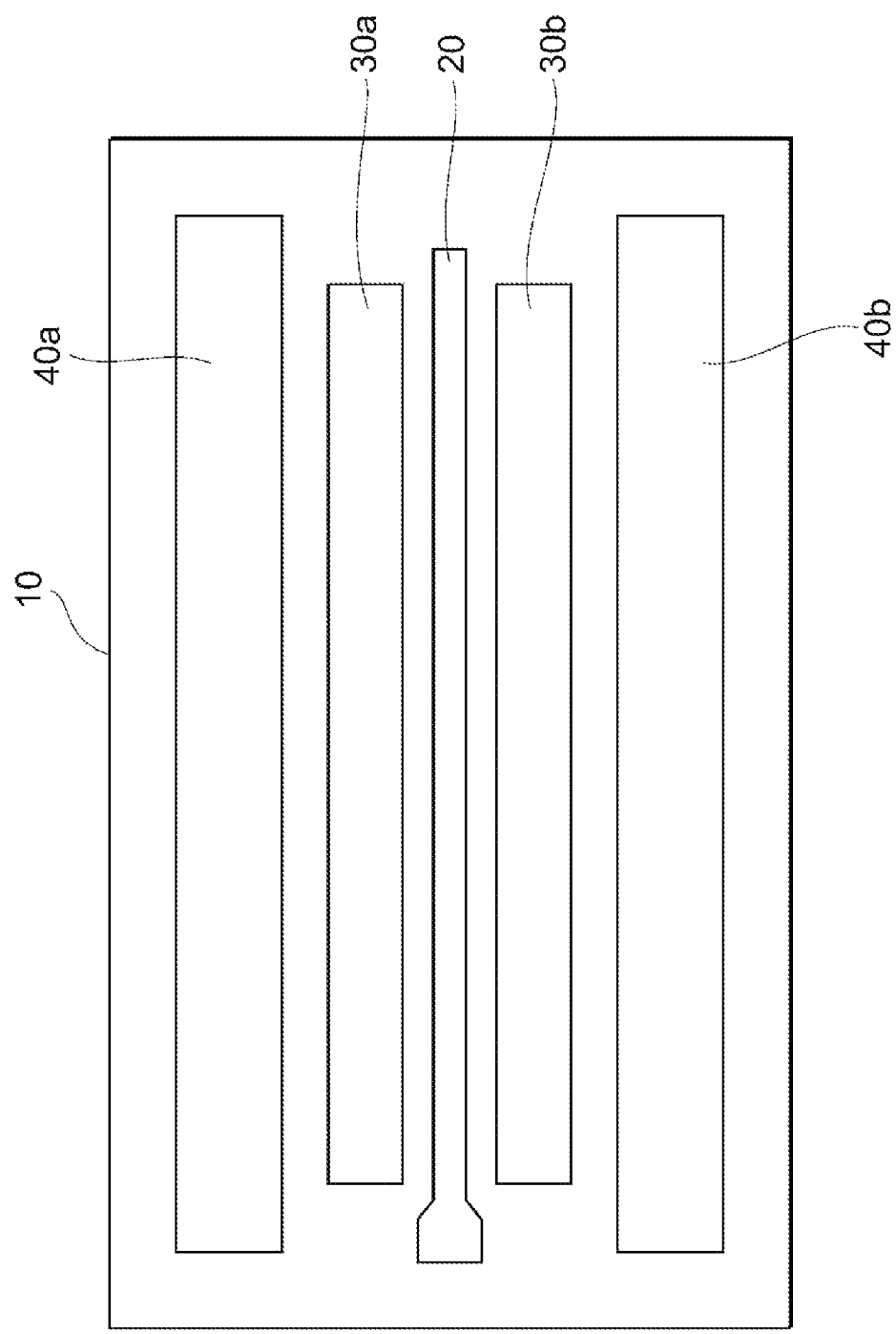
FIG. 2 is a plan view of a cell that constitutes a transistor.

FIG. 2 is a plan view of a cell that constitutes the transistor Q1. The transistor Q2 can be constituted by a cell similar to the cell illustrated in FIG. 2.

As illustrated in FIG. 2, the cell includes, when a principal surface of a semiconductor substrate 10 is viewed in plan, a base layer 20 on the principal surface, two emitter layers 30a and 30b disposed with the base layer 20 positioned therebetween, and collector layers 40a and 40b respectively positioned on the side of the two emitter layers 30a and 30b farther away from the base layer 20. A single unit transistor is constructed in this manner. The term "unit transistor", as used herein, refers to a minimum unit structure that at least includes a base layer, a collector layer, and an emitter layer and that functions as a transistor.

Although not illustrated in FIG. 2, elements corresponding to the capacitor C1 and the resistance element R1, in addition to the unit transistor described above, may also be integrally formed with each cell. In FIG. 1, elements included in the amplifiers 110 and 111 are each identified by its circuit symbol. In this embodiment, however, each of the amplifiers 110 and 111 includes a plurality of cells. In the plurality of cells, the unit transistors are connected such that the collectors are electrically connected together, the emitters are electrically connected together, and the bases are electrically connected together. Thus, the plurality of cells appear to be in a parallel-connected configuration and, as a whole, act as a single amplifier. The number of cells included in each amplifier is not limited to a specific number. In the power amplifier circuit 100, however, the subsequent stage has a higher level of amplification of power than the preceding stage, and thus the number of cells in the subsequent stage (e.g., 20 cells) is larger than the number of cells (e.g., 4 cells) in the preceding stage.

In the following description, the sum of the areas of emitter layers in each cell when the principal surface of semiconductor substrate 10 is viewed in plan (in FIG. 2, the sum of the areas of the emitter layers 30a and 30b) is also referred to as the "emitter area of a cell". Further, the sum of the emitter areas of a plurality of cells included in an amplifier is also referred to as the "emitter area of an amplifier (or emitter area of a transistor)". For example, the amplifier 110 includes four cells. In this case, when the area of the emitter layer 30a is represented by 1, the emitter area of the amplifier 110 (the transistor Q1) is given by 1×2 emitter layers×4 cells=8. Note that the number of emitter layers included in a single cell is not limited to two and may be four, for example. When four emitter layers are included, the four emitter layers and three base layers may be alternately arranged.

Referring back to FIG. 1, the bias circuit 120 includes, for example, transistors Q3 to Q5, a resistance element R3, and a capacitor C3.

The transistors Q3 to Q5 are each an HBT, for example. The transistor Q3 has a collector and a base interconnected (hereinafter referred to also as "diode-connected"). The collector of the transistor Q3 is supplied with a voltage Vb1 via the resistance element R3, and an emitter of the transistor Q3 is connected to a collector of the transistor Q4. The transistor Q4 is diode-connected. The collector of the transistor Q4 is connected to the emitter of the transistor Q3, and an emitter of the transistor Q4 is grounded. Accordingly, a voltage having a predetermined level (e.g., about 2.6 V) is generated at the collector of the transistor Q3.

The transistor Q5 (third transistor) has a collector supplied with a battery voltage Vbatt, a base connected to the base of the transistor Q3, and an emitter connected to the base of the transistor Q1 via the resistance element R1. Accordingly, the bias current Ibias1 is outputted from the emitter of the transistor Q5. Like the transistors Q1 and Q2 described above, the transistor Q5 is constituted by a plurality of cells, for example. FIG. 1 schematically illustrates that, as an example, the transistor Q5 is constituted by three cells.

The resistance element R3 has an end supplied with the voltage Vb1 and another end connected to the collector of the transistor Q3. The end of the resistance element R3 may be supplied with, instead of the voltage Vb1, a current Ib1 from a current source.

The capacitor C3 has an end connected to the collector of the transistor Q3 and another end grounded. The capacitor C3 allows the AC component to flow to ground to suppress a change in amplitude of the voltage at the base of the transistor Q3 which is caused by the detection of the RF signal.

The bias circuit 121 includes, for example, transistors Q6 to Q8, a resistance element R4, and a capacitor C4. The configurations of the transistors Q6 and Q7, the resistance element R4, and the capacitor C4 are similar to the configurations of the transistors Q3 and Q4, the resistance element R3, and the capacitor C3 in the bias circuit 120, respectively, and will not be described in detail herein.

The transistor Q8 (fourth transistor) has a collector supplied with the battery voltage Vbatt, a base connected to a base of the transistor Q6, and an emitter connected to the base of the transistor Q2 via the resistance element R2. Accordingly, the bias current Ibias2 is outputted from the emitter of the transistor Q8. Like the transistors Q1 and Q2 described above, the transistor Q8 may be constituted by a plurality of cells, for example. FIG. 1 schematically illustrates that, as an example, the transistor Q8 is constituted by a single cell.

In the bias circuits 120 and 121, the voltage values of the voltages Vb1 and Vb2 (or the current values of the currents Ib1 and Ib2) may be adjusted to control the amounts of the bias currents Ibias1 and Ibias2, respectively.

Next, the suppression of the variations in the amounts of the bias currents Ibias1 and Ibias2 will be described by using the preceding stage (the amplifier 110 and the bias circuit 120) as an example.

In an emitter-follower bias circuit, typically, the amount of bias current may be affected by an RF signal and may vary. Specifically, when the symbols illustrated in FIG. 1 are used for convenience, if the level of the RF signal RF1 supplied to the base of the transistor Q1 is high, a negative current (a current flowing from the base of the transistor Q1 toward the emitter of the transistor Q5) is generated in the bias current. The negative current, which attempts to flow toward the base from the emitter of the transistor Q5, is cut due to the rectifying characteristics of the P-N junction between the base and the emitter of the transistor Q5. In this way, since the negative part of the bias current is cut, the average of the emitter voltages (voltage Vbb) of the transistor Q5 increases in accordance with the increase in the level of RF signal, resulting in also an increase in average bias current Ibias1.

To address the issue described above, for example, in the configuration disclosed in Japanese Unexamined Patent Application Publication No. 2016-213557, the bias-current supply transistor is in cascode connection, and a portion of the negative current flowing into the upper transistor (corresponding to the transistor Q5 illustrated in FIG. 1) is caused to flow to the lower transistor. In this configuration, however, the impedance at the collector of the lower transistor, viewed from the emitter of the upper transistor, is significantly high. Thus, it is considered that the current is impeded to flow through the lower transistor.

In the configuration disclosed in Japanese Unexamined Patent Application Publication No. 2016-213557, furthermore, a current path that allows the negative current to pass therethrough is disposed between the base and the emitter of the upper transistor to prevent the negative part of the bias current from being cut. In the configuration described above, however, the path that allows the negative current to pass therethrough is implemented by a capacitor, and thus the path has frequency characteristics. Thus, for example, as is common in multiband technologies, if an RF signal has a frequency range which covers a wide area, it is considered that the characteristics may vary according to frequency.

In contrast, the power amplifier circuit 100 is designed such that the ratio of the emitter area of the transistor Q5 to the emitter area of the transistor Q1 in the preceding stage is larger than the ratio of the emitter area of the transistor Q8 to the emitter area of the transistor Q2 in the subsequent stage. The term "ratio of the areas", as used herein, refers to a value given by dividing the emitter area of the bias-current supply transistor (corresponding to the transistors Q5 and Q8) by the emitter area of the amplification transistor (corresponding to the transistors Q1 and Q2). For example, it is assumed that the number of cells of the transistor Q1 in the preceding stage is four, whereas the number of cells of the transistor Q5 is three. In contrast, for example, it is assumed that the number of cells of the transistor Q2 in the subsequent stage is 20, whereas the number of cells of the transistor Q8 is one. In this case, if each cell has an equal emitter area, the ratio of the emitter areas is given by (the transistor Q5/the transistor Q1)=¾ in the preceding stage, and is given by (the transistor Q8/the transistor Q2)=1/20 in the subsequent stage. In this embodiment, accordingly, the ratio of the emitter area of the bias-current supply transistor to the emitter area of the amplification transistor in the preceding stage is larger than that in the subsequent stage.

It is known that the output impedance of a transistor having an emitter-follower configuration is inversely proportional to the amount of emitter current. Thus, when the total amount of emitter current is constant, the amount of current flowing per unit area of the emitter decreases as the emitter area of the transistor increases, resulting in an increase in output impedance. In this embodiment, the ratio of the emitter area of the transistor Q5 to the emitter area of the transistor Q1 is larger than the ratio of the emitter area of the transistor Q8 to the emitter area of the transistor Q2. Thus, when the total amount of emitter current is constant, the output impedance of the transistor Q5 increases. Accordingly, even if the level of the RF signal RF1 is high and the AC amplitude at the base of the transistor Q1 is large, the AC variations of the current at the emitter of the transistor Q5 are eliminated or reduced. In this embodiment, thus, the RF signal detection capabilities of the transistor Q5 are reduced, which prevents the occurrence of a negative current. As a result, the increase in the average amount of the bias current Ibias1 is prevented. In addition, the increase in the voltage Vbb at the emitter of the transistor Q5 is also prevented accordingly.

That is, the power amplifier circuit 100 can eliminate or reduce the variations in the amount of the bias current Ibias1 without using cascode connection or using a capacitor connected between the base and the emitter. Thus, the power amplifier circuit 100 can suppress the deterioration in the linearity of the gain over a wide range, regardless of the band of the RF signal, compared to the configuration disclosed in Japanese Unexamined Patent Application Publication No. 2016-213557.

In the preceding stage, the emitter area of the transistor Q5 is not limited to a specific value, but is preferably larger than or equal to half of the emitter area of the amplification transistor Q1, for example. That is, for example, when the number of cells of the transistor Q1 is four, it is preferable that the number of cells of the transistor Q5 be larger than or equal to two.

In the subsequent stage, an excessively large emitter area of the transistor Q8 in the bias circuit 121 may cause insufficient power relative to the level of power amplification performed by the amplification transistor Q2. Thus, the emitter area of the transistor Q8 in the subsequent stage is preferably smaller than the emitter area of the transistor Q5 in the preceding stage, for example. When the emitter area of the transistor Q8 is small, the average bias current increases in accordance with an increase in the level of the RF signal, which may result in an increase in gain. The gain in the preceding stage is reduced so as to cancel out the increase in gain in the subsequent stage, thereby achieving enhanced linearity when the preceding stage and the subsequent stage are combined.

The power amplifier circuit 100 may include three stages of amplifiers, for example. In this case, for example, the configuration of the bias circuit 120 described above may be applied to the amplifier in the second stage (first transistor) and the configuration of the bias circuit 121 described above may be applied to the amplifier in the third stage (second transistor) to cancel out the increase in gain in the amplifier in the third stage. Alternatively, the configuration of the bias circuit 120 described above may be applied to the amplifier in the first stage (first transistor) and the configuration of the bias circuit 121 described above may be applied to the amplifier in the third stage (second transistor) to cancel out the increase in gain in the amplifier in the third stage.

Figure 3:
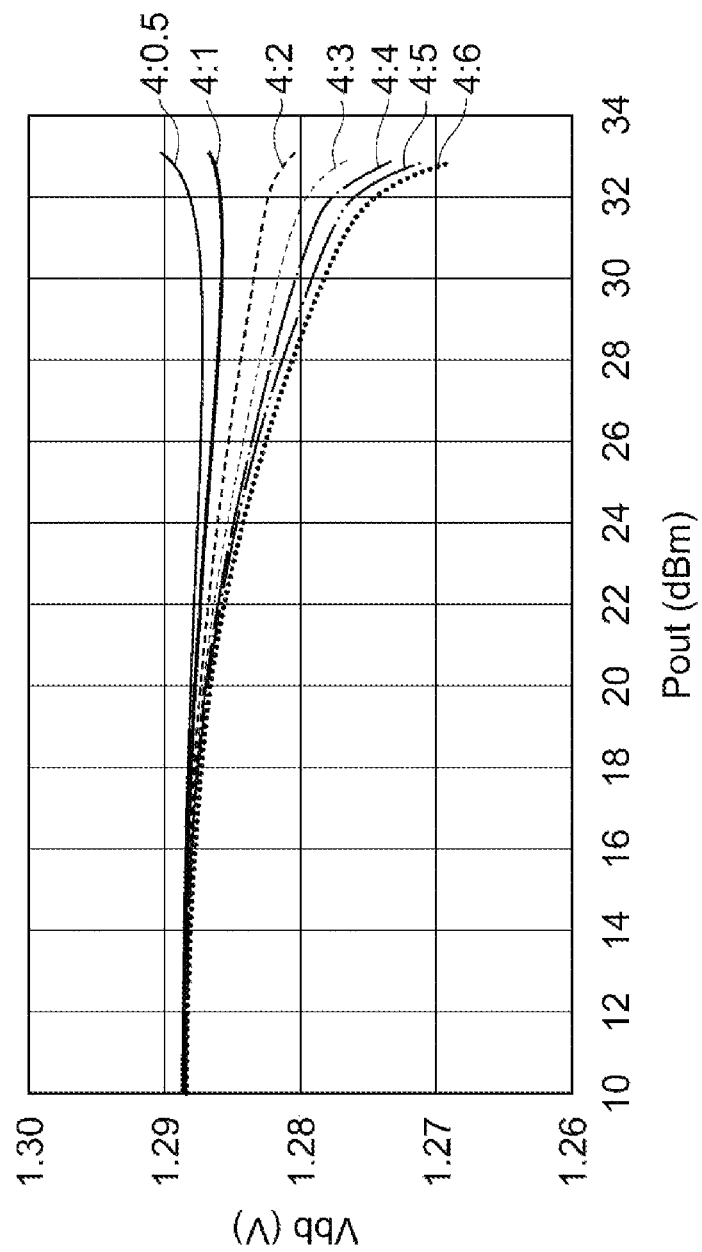
FIG. 3 is a graph illustrating an example of the simulation results of a voltage in the power amplifier circuit according to the embodiment of the present disclosure.

FIG. 3 is a graph illustrating an example of the simulation results of the voltage Vbb in a power amplifier circuit according to an embodiment of the present disclosure. Specifically, the graph illustrated in FIG. 3 indicates a relationship between the voltage Vbb at the emitter of the transistor Q5 and output power Pout when the number of cells of the transistor Q1 and the number of cells of the transistor Q5 are represented as (Q1:Q5)=(4:0.5), (4:1), (4:2), (4:3), (4:4), (4:5), and (4:6). It is assumed here that each of the cells constituting the transistor Q1 includes two emitter layers and that the emitter area of each cell is given by 3.0×40×2 emitter layers=240 $\mu m^2$. On the other hand, it is assumed that each of the cells constituting the transistor Q5 includes four emitter layers and that the emitter area of each cell is given by 3.0×20×4 emitter layers=240 $\mu m^2$. Note that a calculation result for 0.5 cells of the transistor Q5 indicates that obtained when the emitter area thereof is given by 3.0×20×2 emitter layers=120 $\mu m^2$. In the graph illustrated in FIG. 3, the horizontal axis represents the output power Pout (dBm), and the vertical axis represents the voltage Vbb (V).

As illustrated in FIG. 3, when the number of cells of the transistor Q5 is larger than or equal to two whereas the number of cells of the transistor Q1 is four, the increase in the voltage Vbb in accordance with an increase in output power is suppressed. Accordingly, it can be preferable to keep the emitter area of the transistor Q5 larger than or equal to half of the emitter area of the transistor Q1.

Figure 4:
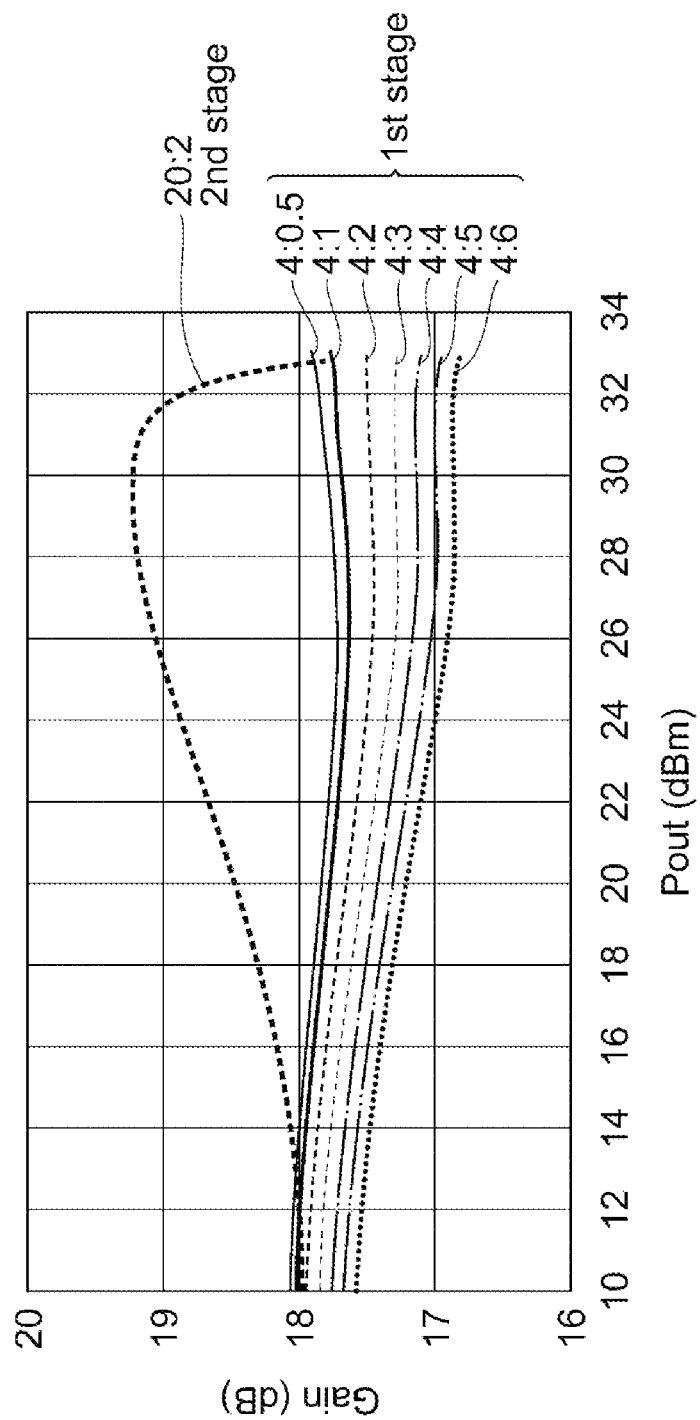
FIG. 4 is a graph illustrating an example of the simulation results of the gain in the preceding stage in the power amplifier circuit according to the embodiment of the present disclosure.

FIG. 4 is a graph illustrating an example of the simulation results of the gain in the preceding stage in a power amplifier circuit according to an embodiment of the present disclosure. Specifically, the graph illustrated in FIG. 4 indicates a relationship between the gain in the transistor Q1 in the preceding stage and the output power Pout when the number of cells of the transistor Q1 and the number of cells of the transistor Q5 are represented as (Q1:Q5)=(4:0.5), (4:1), (4:2), (4:3), (4:4), (4:5), and (4:6) and the number of cells of the transistor Q2 and the number of cells of the transistor Q8 are represented as (Q2:Q8)=(20:2). It is assumed here that each of the cells constituting the transistor Q2 includes two emitter layers and that the emitter area of each cell is given by 3.0×40×2 emitter layers=240 $\mu m^2$. On the other hand, it is assumed that each of the cells constituting the transistor Q8 includes four emitter layers and that the emitter area of each cell is given by 3.0×20×4 emitter layers=240 $\mu m^2$. The conditions for the transistor Q1 and the transistor Q5 are the same as those in the simulation illustrated in FIG. 3 described above. In the graph illustrated in FIG. 4, the horizontal axis represents the output power Pout (dBm), and the vertical axis represents the gain (dB) of the transistor Q1. For the purpose of reference, an example of the gain of the transistor Q2 in the subsequent stage is indicated by a broken line.

As illustrated in FIG. 4, regardless of the emitter area of the transistor Q5, the gain of the transistor Q1 in the preceding stage slowly decreases in accordance with an increase in output power. In contrast, as illustrated in FIG. 4, the transistor Q2 in the subsequent stage can be set such that the gain of the transistor Q2 increases in accordance with an increase in output power. Thus, combining the gain characteristics of the transistors Q1 and Q2 can suppress deterioration in the linearity of the gain of the power amplifier circuit 100.

Figure 5:
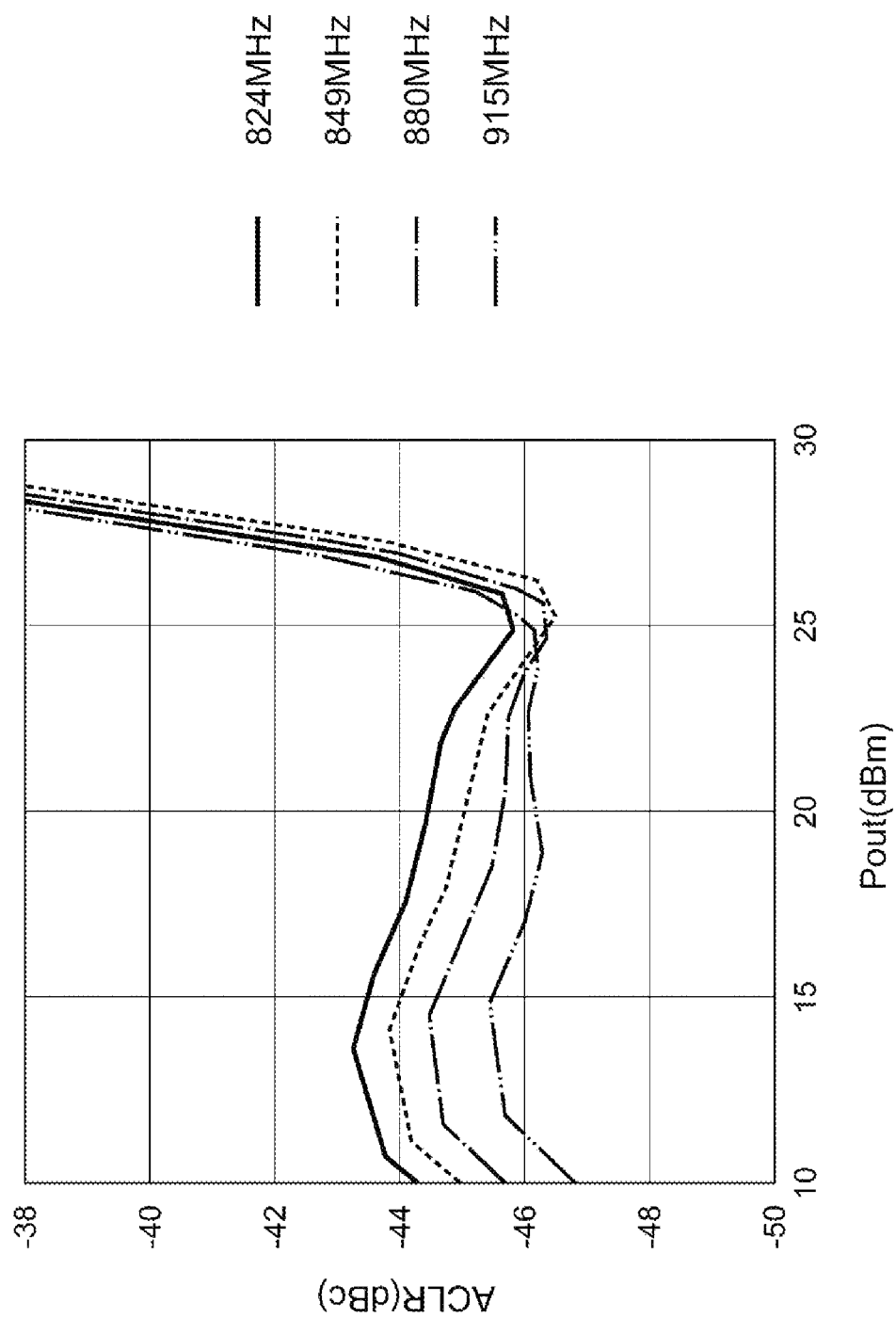
FIG. 5 is a graph illustrating an example of the simulation results of the adjacent channel leakage ratio (ACLR) characteristic of a power amplifier circuit according to a comparative example of the present disclosure.
Figure 6:
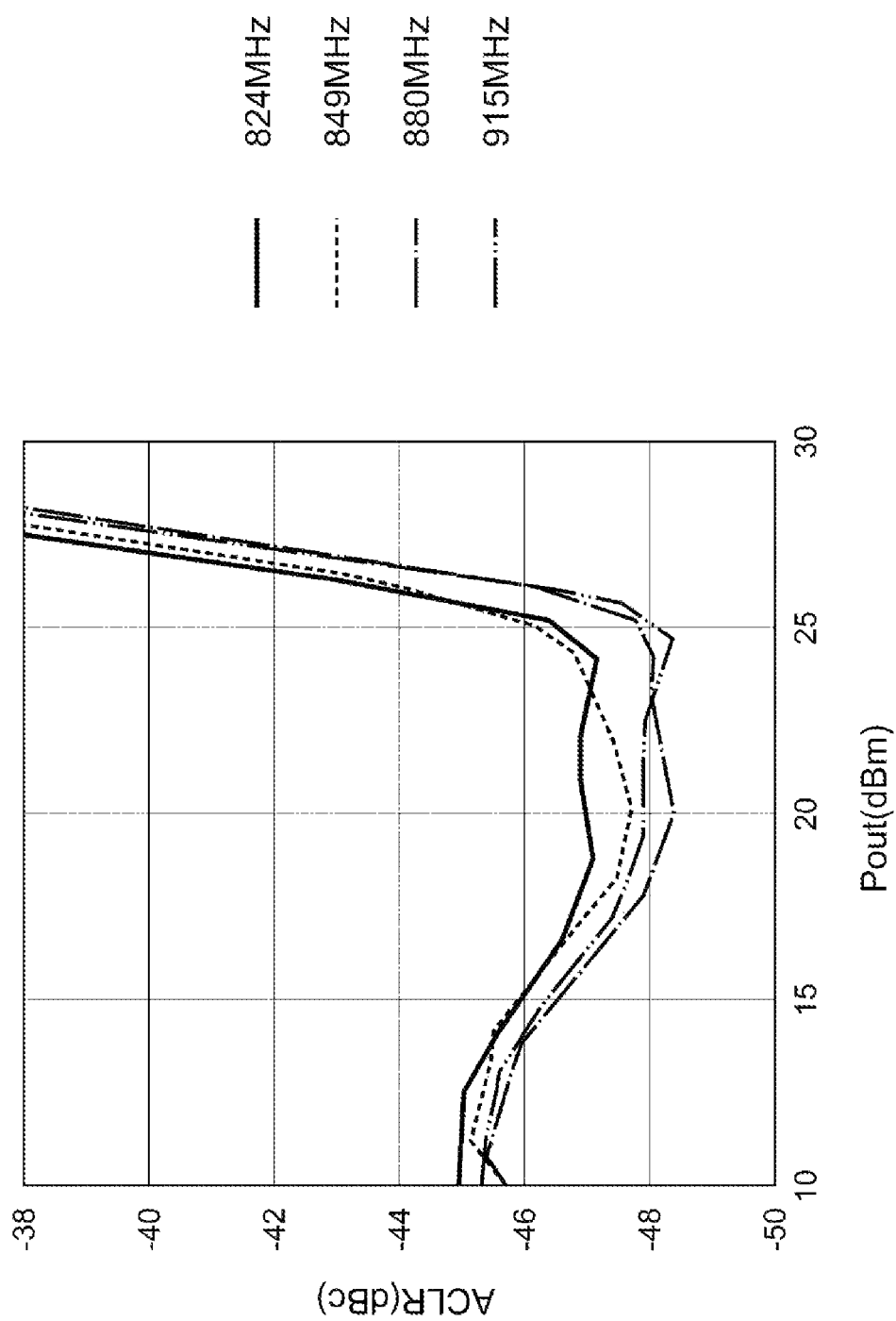
FIG. 6 is a graph illustrating an example of the simulation results of the ACLR characteristic of the power amplifier circuit according to the embodiment of the present disclosure.

FIG. 5 is a graph illustrating an example of the simulation results of the adjacent channel leakage ratio (ACLR) characteristic of a power amplifier circuit according to a comparative example of the present disclosure. FIG. 6 is a graph illustrating an example of the simulation results of the ACLR characteristic of a power amplifier circuit according to an embodiment of the present disclosure. In the comparative example, a capacitor is connected between the base and the emitter of the transistor Q5 illustrated in FIG. 1. FIG. 5 and FIG. 6 illustrate a relationship between the ACLR characteristic and the output power Pout when the power supply voltage is set to 3.4 V under room temperature and the RF signal has frequencies of 824 MHz, 849 MHz, 880 MHz, and 915 MHz. In the graphs illustrated in FIGS. 5 and 6, the horizontal axis represents the output power Pout (dBm), and the vertical axis represents ACLR (dBc).

In the comparative example, as illustrated in FIG. 5, it is found that the ACLR characteristic varies depending on the frequency range of the RF signal. In particular, the variations in the characteristic are noticeable in a region where the output power level is about low to middle, and the deterioration in linearity is found.

In contrast, in the power amplifier circuit 100, as illustrated in FIG. 6, similar ACLR characteristics are exhibited in any frequency range, and it is found that the variations in the ACLR characteristic are reduced compared to those in the comparative example. In addition, the ACLR in the region where the output power level is about low to middle is less than that in the comparative example, and it is found that linearity is enhanced. Thus, this embodiment can suppress deterioration in linearity over a wide range.

An exemplary embodiment of the present disclosure has been described. The power amplifier circuit 100 includes the amplification transistors Q1 and Q2 and the transistors Q5 and Q8 for supplying a bias current. The ratio of the emitter area of the transistor Q5 to the emitter area of the transistor Q1 is larger than the ratio of the emitter area of the transistor Q8 to the emitter area of the transistor Q2. This configuration increases the output impedance of the transistor Q5 and can thus reduce the RF signal detection capabilities of the transistor Q5 without using an element having frequency characteristics such as a capacitor. Thus, the power amplifier circuit 100 can suppress the deterioration in the linearity of the gain over a wide range.

In the power amplifier circuit 100, the emitter area of the transistor Q5 is larger than or equal to half of the emitter area of the transistor Q1. This configuration prevents an increase in the voltage Vbb at the emitter of the transistor Q5 caused by an increase in output power. Thus, the deterioration in the linearity of the gain can be suppressed.

In the power amplifier circuit 100, furthermore, the emitter area of the transistor Q5 is larger than the emitter area of the transistor Q8. This configuration can enhance linearity by combining the gain characteristic of the transistor Q1 in the preceding stage and the gain characteristic of the transistor Q2 in the subsequent stage while maintaining power required in the subsequent stage.

The embodiment described above is intended to help easily understand the present disclosure and is not to be used to construe the present disclosure in a limiting fashion. The present disclosure may be modified or improved without departing from the gist thereof, and equivalents of such modifications or improvements are also included in the present disclosure. That is, the embodiment may be appropriately modified in design by those skilled in the art, and such modifications also fall within the scope of the present disclosure so long as the modifications include the features of the present disclosure. For example, elements included in the embodiment and the arrangements, materials, conditions, shapes, sizes, and so on thereof are not limited to those illustrated exemplarily but can be modified as appropriate. Elements included in the embodiment can be combined as much as technically possible, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first transistor that amplifies a first signal and outputs a second signal;
a second transistor that amplifies a signal corresponding to the second signal and outputs a third signal;
a third transistor that supplies a first bias current or bias voltage to a base of the first transistor; and
a fourth transistor that supplies a second bias current or bias voltage to a base of the second transistor,
wherein a ratio of an emitter area of the third transistor to an emitter area of the first transistor is greater than a ratio of an emitter area of the fourth transistor to an emitter area of the second transistor,
wherein the emitter area of the third transistor is at least half of the emitter area of the first transistor.

2. The power amplifier circuit according to claim 1, wherein the emitter area of the third transistor is greater than the emitter area of the fourth transistor.

3. The power amplifier circuit according to claim 1, wherein the first transistor and the second transistor are heterojunction bipolar transistors.

4. The power amplifier circuit according to claim 3, wherein the fourth transistor and the fifth transistor are heterojunction bipolar transistors.

5. The power amplifier circuit according to claim 1, wherein at least one of the first, second, third, or fourth transistor comprises a plurality of unit transistor cells, and wherein each base in the plurality of unit transistor cells is connected to each other, each collector in the plurality of unit transistor cells is connected to each other, and each emitter in the plurality of unit transistor cells is connected to each other.

6. The power amplifier circuit according to claim 5, wherein the second transistor comprises more unit transistor cells than the first transistor.

7. The power amplifier circuit according to claim 5, wherein the emitter areas of the first, second, third, and fourth transistors is proportional to a number of unit transistor cells of the first, second, third, and fourth transistors, respectively.

8. A power amplifier circuit comprising:
a first transistor that amplifies a first signal and outputs a second signal;
a second transistor that amplifies a signal corresponding to the second signal and outputs a third signal;
a third transistor that supplies a first bias current or bias voltage to a base of the first transistor; and
a fourth transistor that supplies a second bias current or bias voltage to a base of the second transistor,
wherein a ratio of an emitter area of the third transistor to an emitter area of the first transistor is greater than a ratio of an emitter area of the fourth transistor to an emitter area of the second transistor, and
wherein the emitter area of the third transistor is greater than the emitter area of the fourth transistor.

9. The power amplifier circuit according to claim 8, wherein the first transistor and the second transistor are heterojunction bipolar transistors.

10. The power amplifier circuit according to claim 9, wherein the fourth transistor and the fifth transistor are heterojunction bipolar transistors.

11. The power amplifier circuit according to claim 8, wherein at least one of the first, second, third, or fourth transistor comprises a plurality of unit transistor cells, and wherein each base in the plurality of unit transistor cells is connected to each other, each collector in the plurality of unit transistor cells is connected to each other, and each emitter in the plurality of unit transistor cells is connected to each other.

12. The power amplifier circuit according to claim 11, wherein the second transistor comprises more unit transistor cells than the first transistor.

13. The power amplifier circuit according to claim 11, wherein the emitter areas of the first, second, third, and fourth transistors is proportional to a number of unit transistor cells of the first, second, third, and fourth transistors, respectively.

14. A power amplifier circuit comprising:
a first transistor that amplifies a first signal and outputs a second signal;
a second transistor that amplifies a signal corresponding to the second signal and outputs a third signal;
a third transistor that supplies a first bias current or bias voltage to a base of the first transistor; and
a fourth transistor that supplies a second bias current or bias voltage to a base of the second transistor,
wherein a ratio of an emitter area of the third transistor to an emitter area of the first transistor is greater than a ratio of an emitter area of the fourth transistor to an emitter area of the second transistor, and wherein at least one of the first, second, third, or fourth transistor comprises a plurality of unit transistor cells, and wherein each base in the plurality of unit transistor cells is connected to each other, each collector in the plurality of unit transistor cells is connected to each other, and each emitter in the plurality of unit transistor cells is connected to each other.

15. The power amplifier circuit according to claim 14, wherein the first transistor and the second transistor are heterojunction bipolar transistors.

16. The power amplifier circuit according to claim 15, wherein the fourth transistor and the fifth transistor are heterojunction bipolar transistors.

17. The power amplifier circuit according to claim 14, wherein the second transistor comprises more unit transistor cells than the first transistor.

18. The power amplifier circuit according to claim 14, wherein the emitter areas of the first, second, third, and fourth transistors is proportional to a number of unit transistor cells of the first, second, third, and fourth transistors, respectively.

* * * * *